United States Patent
Lyn et al.

(10) Patent No.: US 6,896,170 B2
(45) Date of Patent: May 24, 2005

(54) WIRE BONDER FOR BALL BONDING INSULATED WIRE AND METHOD OF USING SAME

(75) Inventors: Robert J. Lyn, Thornhill (CA); John I. Persic, Toronto (CA); Young-Kyu Song, Scarborough (CA)

(73) Assignee: Microbonds, Inc.

( * ) Notice: Subject to any disclaimer, the term of this patent is extended or adjusted under 35 U.S.C. 154(b) by 0 days.

(21) Appl. No.: 10/300,416

(22) Filed: Nov. 20, 2002

(65) Prior Publication Data

US 2003/0234275 A1 Dec. 25, 2003

(30) Foreign Application Priority Data

Nov. 20, 2001 (CA) .............................................. 2363409

(51) Int. Cl.⁷ .......................... B23K 37/00; B23K 31/02
(52) U.S. Cl. .................. 228/4.5; 228/180.5; 219/56.21; 219/56.22
(58) Field of Search ............................... 228/4.5, 180.5; 219/53.21, 56.22

(56) References Cited

U.S. PATENT DOCUMENTS

| | | | |
|---|---|---|---|
| 3,627,192 A | | 12/1971 | Killingsworth |
| 4,020,543 A | * | 5/1977 | Pennings ..................... 29/423 |
| 4,513,190 A | * | 4/1985 | Ellett et al. .............. 219/56.21 |
| 4,586,642 A | * | 5/1986 | Dreibelbis et al. ........... 228/4.5 |
| 4,861,533 A | * | 8/1989 | Bertin et al. .................. 264/81 |
| 4,909,427 A | | 3/1990 | Plaisted et al. |
| 4,950,866 A | * | 8/1990 | Kojima et al. ......... 219/137 PS |
| 4,976,392 A | * | 12/1990 | Smith et al. ................. 228/102 |
| 5,176,310 A | * | 1/1993 | Akiyama et al. ........ 228/180.5 |
| 5,285,949 A | * | 2/1994 | Okikawa et al. ......... 228/179.1 |
| 6,156,990 A | * | 12/2000 | Ellis ........................ 219/56.21 |

FOREIGN PATENT DOCUMENTS

| | | |
|---|---|---|
| DE | 2517017 A1 | 4/1975 |
| DE | 3037735 A1 | 10/1980 |
| JP | 62016537 | 1/1987 |
| JP | 05-13491 A * | 1/1993 |
| JP | 10-41335 A * | 2/1998 |

* cited by examiner

Primary Examiner—L. Edmondson
(74) Attorney, Agent, or Firm—Hoffmann & Baron, LLP (57) ABSTRACT

A wire bonder for bonding an insulated wire to a surface is disclosed. The bonder includes a bond head, having a bonding position adjacent to said surface and a wire preparation position spaced apart from the surface. There is a wire holder on the bond head, the wire holder being sized and shaped to permit a free end of the insulated wire to extend from the wire holder when the bond head is in the spaced apart position. A source of insulated wire for said bond head is provided as well as an electrical discharge wand positioned adjacent to said bond head when the bond head is in the spaced apart position. The wand directs sufficient electricity at the extending free end of the insulated wire to form a bond ball on the free end. A ground associated with the insulated wire, is provided the ground being sized and positioned to conduct electrical energy away from the insulated bond wire to prevent the insulation on the bond wire remote from the free end from being damaged.

19 Claims, 5 Drawing Sheets

WIRE BONDER FOR BALL BONDING INSULATED WIRE AND METHOD OF USING SAME

FIELD OF THE INVENTION

This invention relates generally to the field of bonding wires to surfaces and more particularly this invention relates to micro bonding wires of the type used for example in microelectronics on bond pads, chip packages, circuit boards and the like.

BACKGROUND OF THE INVENTION

Miniaturization is a feature of modern electronic devices. Most miniaturization occurs in chips, which may, for example, be prepared on silicon wafers through various techniques. Chips generally contain densely packed electronic circuits. However, chips, no matter how small or densely packed with circuits need to be connected to other devices to make a complete electronic-based device. For example, chips may need to be connected to other chips, either directly or through a circuit board, or to other electronic components either directly or indirectly. Thus, chips are typically provided with input and output ports, commonly referred to as bonding pads, to allow for wires to be connected or bonded to the ports to make a functioning device.

Typically, the chips are so small and fragile that it is too difficult to manipulate them directly during a manufacturing process. Therefore electronic manufacturers have made use of substrates or lead frames, which generally take the form of a planar substrate onto which the chips are mounted. The substrate includes a number of bond pads (sometimes referred to as bond fingers) which are electrically connected to the chip bond pads by means of bonding wires. These bond fingers are typically located around the outside edge of the substrate in a non-contacting manner (to prevent short circuiting). The bond fingers are routed along the substrate to leads (typically metal or solder ball connections), which may then be electrically connected to other components as needed to complete the electrical device. A chip mounted to a substrate and having bond wires extending between the chip bond pads and the leads is referred to as a "packaged" chip.

Figure 1:
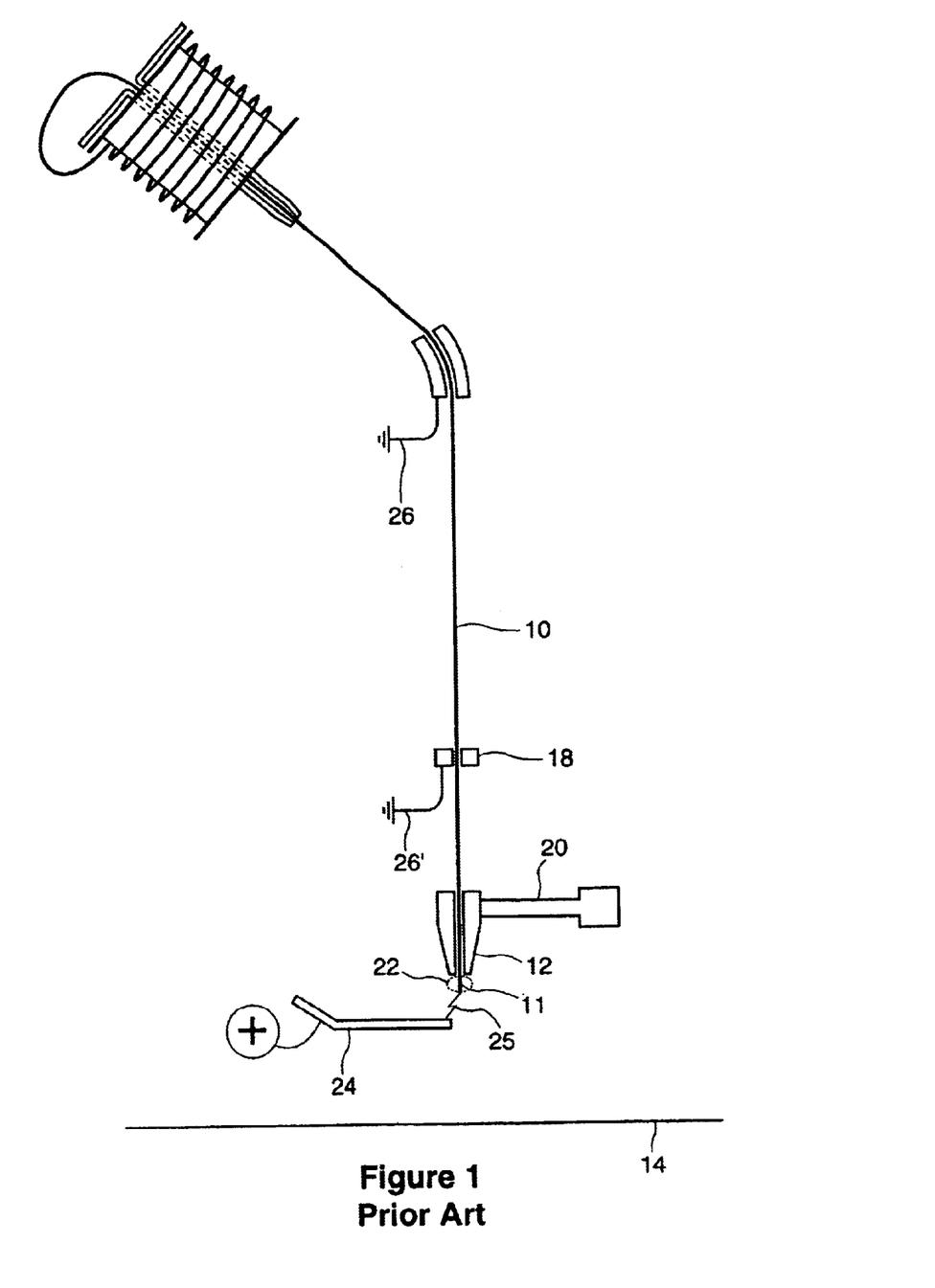
FIG. 1 shows a schematic view of a conventional prior art wire bonder.

Currently, the fabrication of an electrical connection between the leads and the bond pads is accomplished by a micro bonding wire bonder. FIG. 1 shows a typical device in which uninsulated micro wire 10 is fed through a bonding head, which is in the form of a wire holding capillary 12. The bonding head is an element which can be lowered onto a surface 14 to make a wire bond and then raised above the surface 14. To facilitate the spooling of wire through the capillary, wire clamp 18 is used. Either the surface 14 can be moved or the bonding head can be moved to permit the bonding head to contact a different point on the surface. Thus an uninsulated wire can be stitch bonded at first one point and then another point on the surface to complete a needed electrical connection. Typically the capillary 12 will be mounted on an ultrasonic arm 20, which applies enough vibration and pressure to bond the wire 10 to the surface 14.

In the wire bonding method called ball-wedge bonding, a bond ball 22 (shown in ghost outline) is formed at the end of the wire 10 for this purpose. To form the bond ball 22 a section of the wire 10 is extended past the capillary 12 or bond head in the direction of the surface 14 to a free end 11. Located adjacent to the bond head is an arc discharge wand 24, for releasing an arc 25 of electrical energy at the free end 11 of the wire 10. The wire 10 is grounded separately from and just beyond the nonconductive capillary at 26. The arc, released from the wand 24 therefore jumps to the free end 11 of the wire 10, runs along the wire and out through the ground 26. To ensure electrical contact with the conductive ground 26, the wire 10 is bent around the ground 26 as shown. Alternately, the ground may be located at the clamps 18 as shown by 26'.

The arc 25 has sufficient energy to cause the free end 11 of the wire 10 to melt, and as a liquid, due to surface tension, it naturally forms a drop shape or ball 22. The ball 22 can then be pressed and bonded onto the surface to form a good electrical connection. Having the ball 22 means that more conductive material is present and that the bond is formed across a larger cross-sectional area at the wire/surface bond interface, improving both the quality of the electrical connection and the mechanical strength of the wire/surface bond. Further, the presence of a bonded ball 22 enables the capillary 12 to be close enough to the surface 14 to form the bond, while avoiding direct contact with the surface 14. Further, the utilization of a ball connection as the first bond on the chip pad, allows the bonding head to move in any direction to facilitate the second bond on the substrate bond finger. This 'omni-directional' bonding is a characteristic of the ball bonding method, enabling flexibility and throughput advantages over the 'uni-directional' wedge-wedge bonding method.

The micro wires used in this type of wire bonding are uninsulated. The chip packaging and bonding pad allow the inputs and outputs for the chip to be separated by a gap large enough that the uninsulated micro wires can be used without short circuits occurring. However, the use of uninsulated wires means relatively large gaps between wires and places constraints upon the bond wire pattern to avoid short circuits. The requirement for such large gaps frustrates miniaturization and yields unnecessarily long circuit paths which reduce the speed and efficiency of the assembled device. Recently therefore it has been proposed that insulated wires be used. However, insulated wires cannot be bonded in the usual way. More specifically once the wand discharges its energy into the wire, the excess electricity will pass along the wire until it reaches the remote ground 26. At that point the excess electricity will jump through the insulation to the ground 26 burning a hole in the insulation. This leads to damaged wire which cannot be used. Thus, what is needed is a method of bonding and a bonding device which is suitable for use with insulated micro wire and which preserves the quality of the insulation of the wire remote from the bond locations. A difficulty to overcome is the very restricted space available at the bond head to deal with the ground issue.

SUMMARY OF THE INVENTION

What is desired according to the present invention is a bonding apparatus and method for effectively bonding insulated wire to a surface which does not damage the wire remote from the bond point. The device and method should be compatible with existing equipment so as to be easy to integrate into existing equipment. In this way there is no need for a completely new bonding device, but merely an upgrade kit of components. Such an apparatus would therefore be easy to install and relatively inexpensive to produce yet would provide secure bonding results for insulated wire. Further the solution must overcome the restricted space available at the bonding head of a micro wire bonder.

Therefore according to one aspect of the present invention there is provided wire bonder for bonding an insulated wire to a surface, said wire bonder comprising:

a bond head, having a bonding position adjacent to said surface and a wire preparation position spaced apart from said surface;

a wire holder on said bond head, said wire holder being sized and shaped to permit a free end of said insulated wire to extend from the wire holder when said bond head is in the spaced apart position;

a source of insulated wire for said bond head;

an electrical discharge wand positioned adjacent to said bond head when said bond head is in the spaced apart position for directing sufficient electricity at said extending free end of said insulated wire to form a bond ball on said free end; and a ground associated with said insulated wire, said ground being sized and positioned to conduct electrical energy away from said bond wire to prevent said insulation on said bond wire remote from said free end from being damaged.

According to another aspect of the present invention there is provided a method of bonding insulated wire, said method comprising the steps of:

feeding an insulated wire through a bonding head until the insulated wire is proud of the bond head at a free end;

discharging an arc of electricity at said free end to form a bond ball;

grounding said insulated wire at either end of said wire to prevent said discharged electricity from going to ground anywhere along said insulated wire apart from at said ends; and advancing said bond head onto a surface to attach said bond ball and said insulated wire to a surface.

According to a further aspect of the invention there is provided a kit for converting an uninsulated wire bonder to an insulating wire bonder, said kit comprising:

a replacement bond head for bonding insulated wire sized and shaped to replace a bond head suitable for uninsulated wire;

a wire holder associated with said replacement bond head for permitting insulated wire to extend proud of said bond head at a free end;

a ground located at either end of said insulated wire, said ground sized and shaped to cause electricity directed at said free end of said insulated wire to go to said ground without going to ground along said insulated wire between said ends.

BRIEF DESCRIPTION OF THE DRAWINGS

Reference will now be made, by way of example only, to preferred embodiments of the invention by reference to the following drawings in which.

DETAILED DESCRIPTION OF THE PREFERRED EMBODIMENTS

Figure 2:
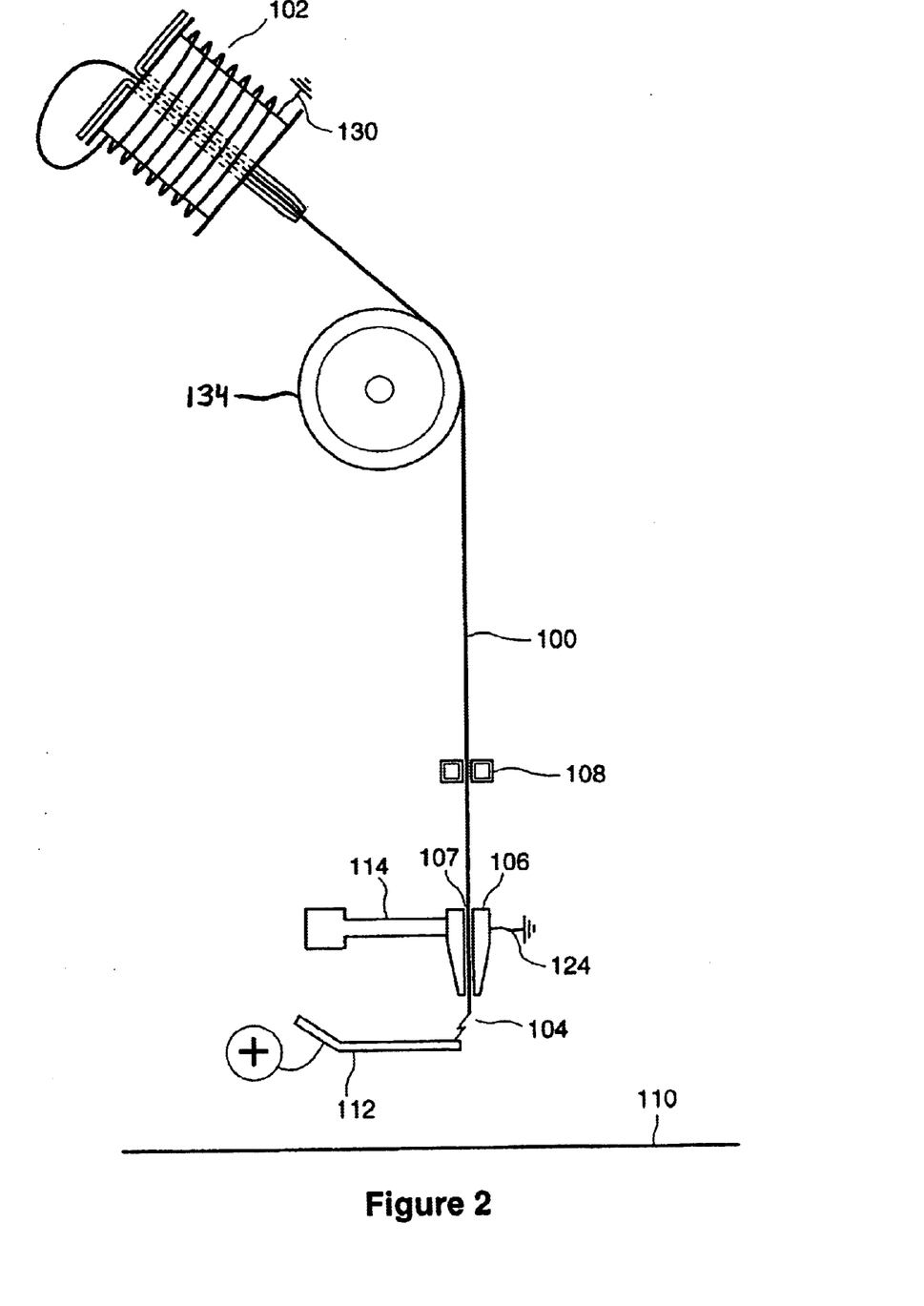
FIG. 2 shows a schematic view of a wire bonder according to the present invention.

FIG. 2 shows the elements of the present invention. The insulated bond wire 100 is shown extending from a spool 102 remote from a free end 104. The spool acts as a source of insulated wire for the bonder of the present invention. A conductive or metal capillary 106 is also shown having a central bore or tube 107, through which the wire 100 is fed. The capillary 106 acts as a wire holder during the formation of a ball for ball bonding. Although many types of material may be used for the capillary due to an advantageous combination of strength, conductivity, and ease of manufacture, a tungsten carbide capillary is preferred.

A wire clamp 108 is located above the capillary 106 distal from a surface 110 to which the wire 100 is to be bonded. An electrical discharge torch 112 is shown in position adjacent to the free end 104 of the wire 100, and generally below the capillary or wire holder. Also shown is an ultrasonic transducer arm 114 which generates sufficient ultrasonic and compressive energy to bond a ball formed at the free end of the wire to a surface.

Figure 3:
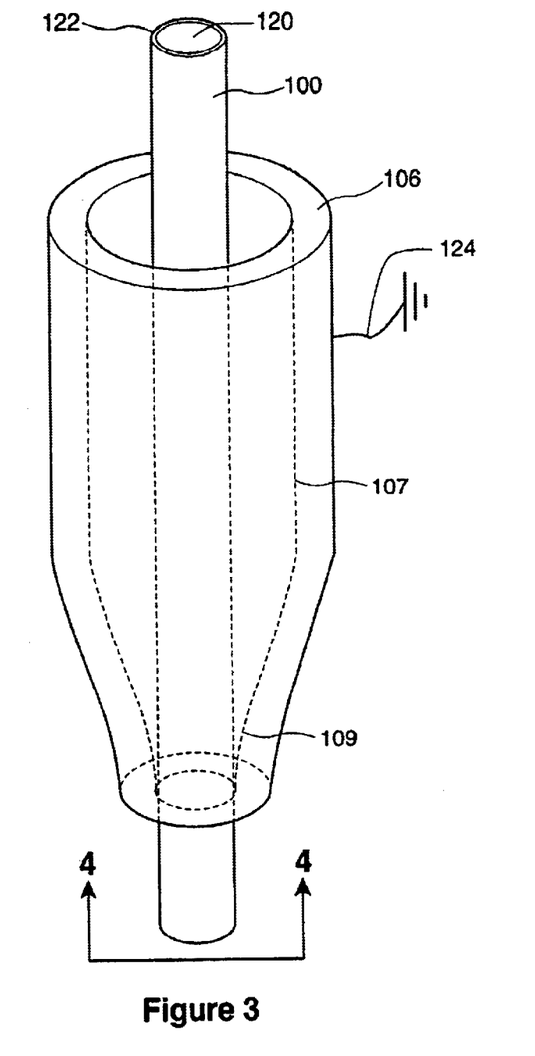
FIG. 3 shows a close up of a wire holder or capillary for insulated wire according to the present invention.

FIG. 3 is an enlarged view of the capillary 106 according to one aspect of the present invention. The preferred form of capillary 106 is a metal capillary which is grounded, for example to a conductive element, such as the ultrasonic transducer 114, which is then itself grounded to the electrical ground of the EFO (Electronic Flame Off) Circuit, as shown in FIG. 2. The metal capillary 106 has a tube 107 which includes a tapered section 109 which closely tapers to the diameter of the insulated wire 100, most preferably adjacent to an exit from the capillary 106. According to the present invention the opening for the wire in the capillary 106 is most preferably closely sized to the diameter of the wire 100, but not so close as to cause the wire 100 to bind or otherwise become not free running through the capillary 106. Most preferably the ground provided by the metal capillary closely surrounds the insulated wire at the point that the insulated wire leaves the tube 107.

Figure 4:
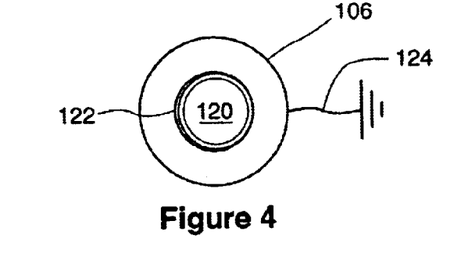
FIG. 4 shows in a cross section along lines 5—5 in FIG. 4.

In FIG. 4 there is shown a cross section through the end of the capillary 106 of FIG. 3. The insulated wire 100 is shown having a conductive core 120 and outer insulation 122. The metal capillary 106 is also shown with an electrical connection to ground at 124. It will be appreciated that the present invention comprehends various forms of electrically conductive capillary structures, such as a ceramic capillary which is coated with an electrical conductive layer, such as a metal coating. The metal coating may completely cover a nonconductive core, or may merely extend along a portion of the core, or, as noted above, the capillary may be a solid conductive material such as metal. What is required is a conductor which is sufficient to carry away to a ground an arc charge as explained in more detail below. Thus many different configurations of capillary are comprehended in which a ground is provided and associated with the insulated wire. Such a ground is referred to herein as a first ground.

Figure 5:
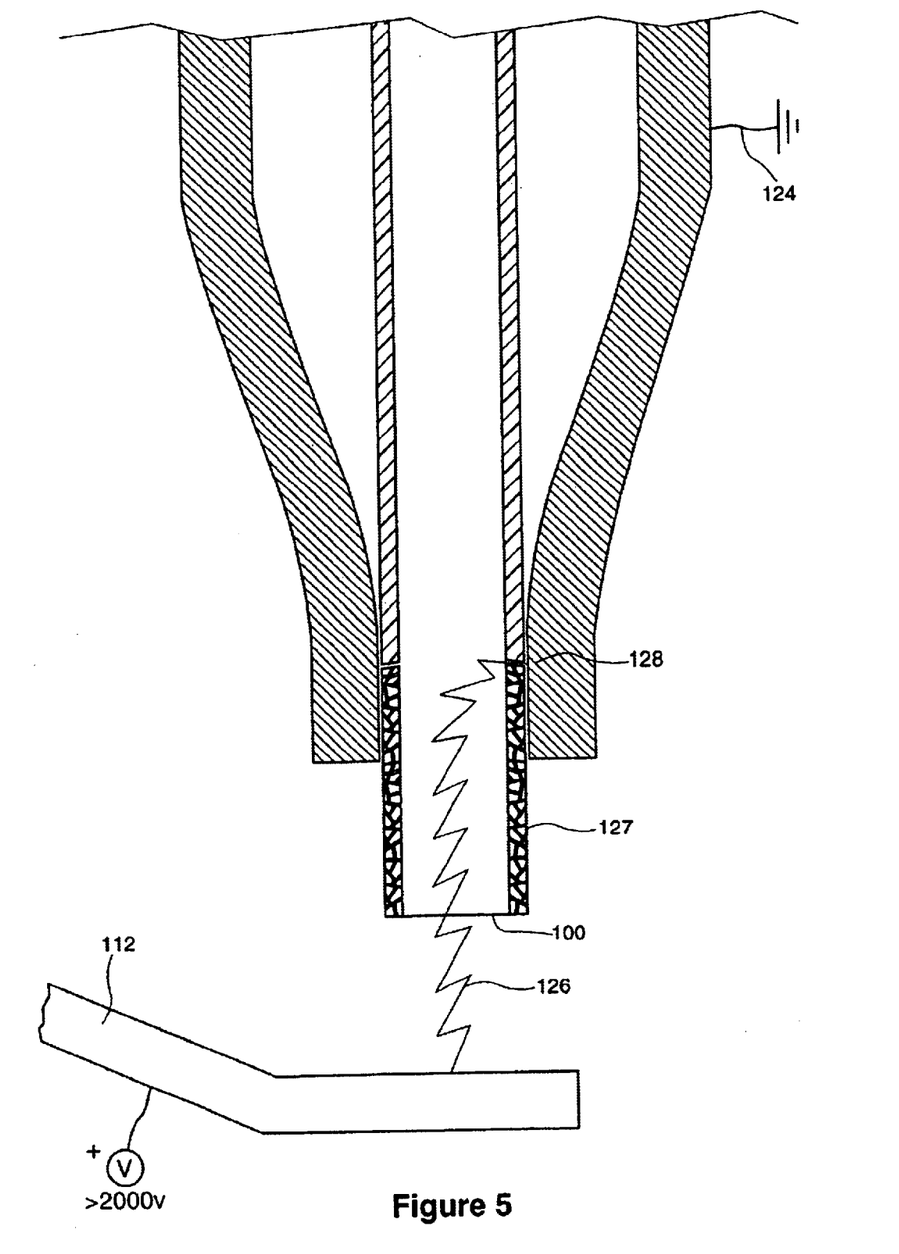
FIG. 5 shows and electrical discharge arc according to the present invention.

FIG. 5 shows one form of the present invention in operation for a bench-top, manually operated wirebonder. It will be understood that the present invention applies equally to wire feed systems for automatic wire bonders, such as K&S 8028, for example. The first step is to have the wire clamp on the insulated wire and to allow the wire to extend through the tube 107 of the capillary 106 until the free end of the wire stands proud of the capillary. The next step is for the wand 112 to release a charge or arc of electrical energy 126 at the wire which is shown schematically. This energy 126 then jumps to the wire 100 and even though the wire is insulated the energy 126 exceeds the electrical breakdown potential of the insulation and breaks through the insulation 127 to the ground, in this case the electrically conductive capillary at 128. In the process the free end of the wire 100 is melted, the insulation destroyed and a suitable ball formed. Essentially what is required is to manage the arc energy so that it strikes the free end of the wire, and so that it does not damage the insulation on the wire remote from the free end. Thus, providing a ground in the capillary causes the extra arc energy to be immediately removed, thus preserving the insulation on the wire intermediate the ends thereof from being damaged. What is required is that there is sufficient conductivity present, in the ground, to cause the arc to first jump to the free end of the wire and then to burn through the insulation to reach ground, adjacent to the ball formed on the wire.

Good results have been achieved where the voltage at which a breakdown of the insulation occurs is much less than the voltage supplied by the discharge wand. More specifically, for insulation which breaks down in the range of 40 to 200 volts, the preferred discharge voltage is greater than 2000 volts. Thus, the preferred ratio of discharge voltage to breakdown voltage is at least 10, and may be even 50 or more.

It can now be appreciated why the taper of the capillary tube 107 to a narrow throat is favoured in the conductive capillary of present invention. The taper of the capillary enhances the ability of the arc energy released into wire to reach the ground at the narrow throat. Once the arc energy is released and jumps to the free end of the wire the insulation surrounding the wire will begin to break down. As it does so, providing the throat opening in the capillary is closely enough sized to match the wire, the now exposed wire will likely be in contact with the capillary at some point around the circumference, or if not in contact be close enough to the capillary to permit the electrical arc energy to further jump to the ground at the throat. The energy, once removed from the wire, can do no further damage to the wire or the insulation remote from the free end.

It will be understood by those skilled in the art that tapering the tube 107 through the capillary is only one way of promoting closeness between the ground and the wire. Other ways are also comprehended by the present invention, such as forcing the wire around a contact or the like, but these are less preferred, because they make the wire less free running and so slightly harder to work with. Provided, however, that the ground is in close proximity to the wire when the arc is discharged, then adequate results can be obtained. In this sense close proximity means close enough that the excess arc energy is drawn off from the wire to the ground. It will now be appreciated that insulation on the wire, between a free end where the arc energy jump to the wire, and adjacent to the throat where the arc energy jumps to the ground will be compromised. To limit the damage to the insulation, it is therefore preferred to have the throat located close to where the ball is formed, so the jump to ground will also occur close to where the ball is formed. In such a case, uncompromised insulation will begin close to the ball, reducing the risk of short circuits. Essentially what is desirable is to limit the damage to the insulation to a region close to the ball. The closer the uncompromised insulation extends to the ball the better. Thus, good results have been obtained by having the throat located where the wire exits from the capillary.

A further aspect of the present invention is that the electrical energy will encounter some resistance as it passes through the ground at the end of the capillary which means that the ground acts like a resistor and generates heat. Some of this heat is also transferred to the wire to help make the ball form for ball bonding.

FIG. 2 shows an alternate path of the electrical arc energy according to a further aspect of the present invention. In this embodiment the energy jumps into the free end, along the wire and then into a second ground 130 located at the spool end of the wire 100. Thus, according to a further aspect of the present invention a ground 130 may be placed at the spool end of the wire 100, remote from the ball bonding end 104. Such a ground 130 is useful to drain off any additional charges that might otherwise travel up the insulated wire 100, in spite of the first ground 124, during the arc discharge. In some cases, for short lengths of insulated wire it is possible to form a ball on the free end of the wire using only such a second ground 130 as illustrated in the following example. A test of insulated gold wire of 0.001 inch diameter was performed and the resistance of 1 meter was found to be 48 ohms. A variable resistor was attached to the end of the wire and gradually increased to simulate greater lengths of wire. At 15,000 ohms, which correlates to a length of wire of approximately 312 m it became more difficult to form a ball at the same EFO settings as at lower simulated wire lengths. At a resistance of 100,000 ohms, approximating 2083 m, it was very difficult to form a ball without increasing the power of the arc significantly. In these experiments the capillary was of the nonconductive type.

Further, there exists a small change in ball diameter for increased resistance. Essentially, the larger the resistance is, for the same arc energy, the smaller a ball is formed. As well, a critical point was observed for a given arc energy (or specific arc setting on the EFO), which represents a resistance so large that the arc cannot be made to jump to the wire. Thus, for greater lengths of wire, to ensure the arc jumps to the wire, more arc energy is required. Thus, end grounding will be sufficient for shorter lengths of wire spools or lower arc energies, but not for longer wire spool lengths unless the arc energies are raised. For example, reasonable results were achieved with simulated wire lengths of between 1,000 ft to 2000 ft, which, for example, may correspond to medium to high volume production spool sizes. One aspect of the present invention therefore is that provided an arc can be induced to jump to the free end of the wire, the ball size changes, across a range of resistance values (i.e. a range of wire lengths) are not so much as to affect the ability to form a bond at a surface with the ball so formed. Thus, even when using the spool end second ground only there is no need to adjust the arc energy as the wire on the spool is used up and becomes shorter.

It will further be appreciated that when using a second ground, as a precaution the wire path for the insulated wire from the spool to the capillary should be kept insulated from any potential grounds to prevent unwanted arcing through the insulation remote from either end of the wire. So, in FIG. 2 additional insulation is added onto the wire clamp 108, insulation on a pulley 134, and insulation on the spool 102. It will be understood that the wire path illustrated in the drawings is in schematic form only, and that in practice, depending upon the actual configuration of the wire bonder there may be other elements present in or defining the wire path through the bonder, particularly accounting for manual and automated wire bonders models and multiple manufacturers of such wire bonders. Thus, it will now be understood that the ground 26 used in a conventional prior art bonder which grounds the uninsulated wire must be removed or covered with a highly insulating material to prevent arc energy from seeking ground at that point and damaging insulation on the wire. Further, all other parts of the wire path from the spool end of the wire to the free end extending from the capillary need to be insulated to prevent any arc energy from jumping through and thus burning a hole in the insulation.

Figure 6:
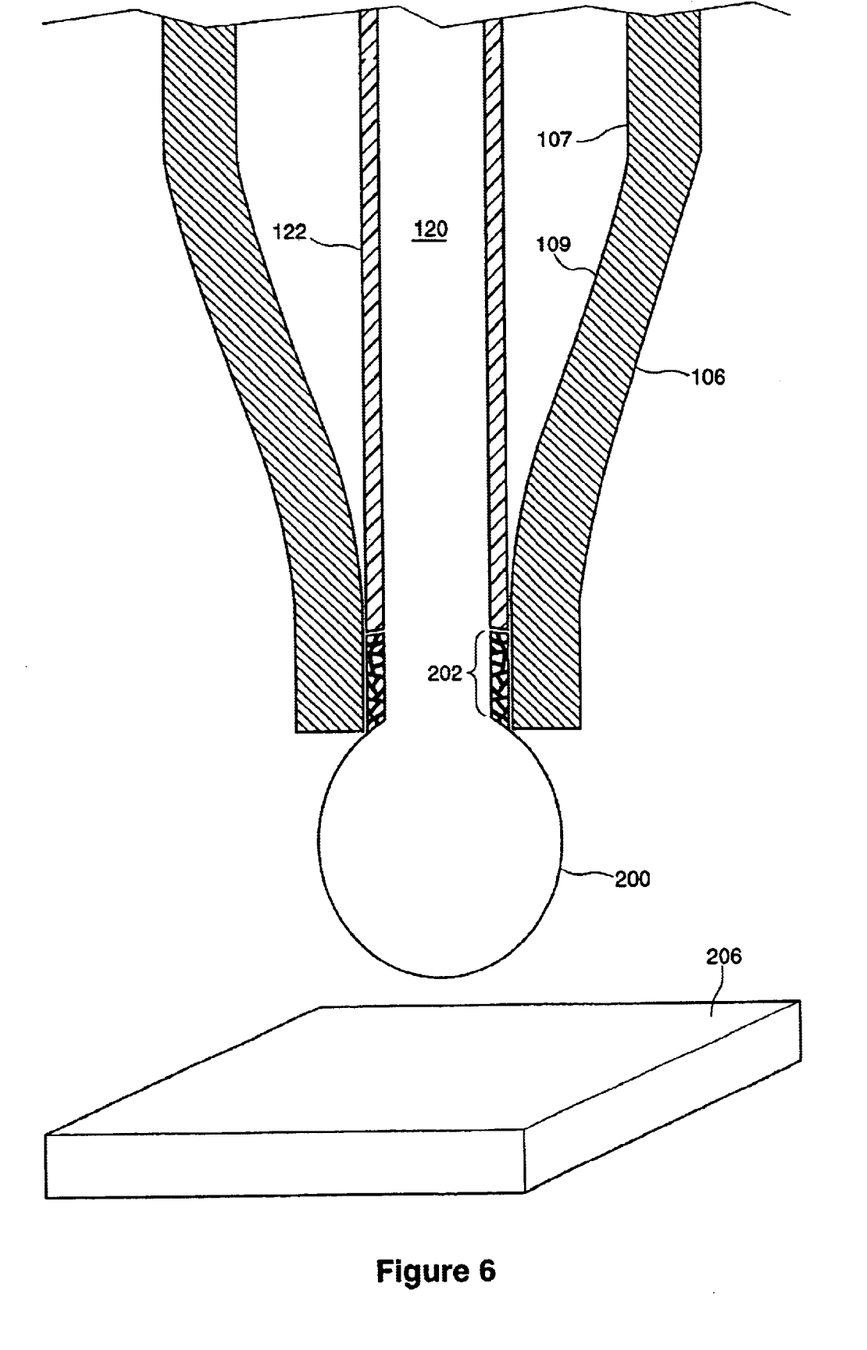
FIG. 6 shows a bond ball formed according to the present invention.

FIG. 6 shows a ball 200 formed according to the present invention. The capillary 106 is shown and the insulation 122 is essentially destroyed in the region 202 above the ball. A surface 206 is also shown and it can now be appreciated that upon the ball being pressed onto the surface a bond can be form by compression, ultrasonic welding or the like between the ball and the surface. FIG. 6 illustrates the bond head, comprised of the capillary and the insulated wire in a wire preparation position. In this position, the bond head is spaced above the surface and the discharge wand may be brought into close proximity to the wire to release the arc energy. This raised position above the surface is referred to as the wire preparation position. When the bond head is lowered so the bond ball contacts the surface this is referred to as a bonding position. The present invention applies equally to devices which move the surface into and out of engagement with the bond head as well as those which move the bond head into and out of engagement with the surface.

In summary the present invention comprehends providing a ground for a wire bonding machine for insulated bond wire. In one embodiment a first ground is provided adjacent to a free end, when the ball is formed. In another embodiment a second ground is provided at a spool end, and the wire path through the bonder is insulated at all wire contacting points. In the most preferred form of the invention, both first and second grounds are provided at either end, and a fully insulated wire path is provided in between the first and second grounds to minimize the risk of an insulation burn out along the length of the wire.

Thus the present invention provides a solution to ensuring the quality of insulation on an insulated microwire as used in a bonder is preserved, intermediate the ends thereof. The present invention allows a conventional bonder to be easily converted into an insulated wire bonder by the replacement of certain parts with other parts having essentially the same size and function, but with added capabilities. In one aspect all that needs to be done is to provide a ground adjacent to the free end of the insulated microwire by replacing a dielectric capillary with a conducting capillary which is grounded. Insulation of the wire path through the bonder is preferred to prevent any stray energy from arcing through the insulation at an intermediate location on the wire. In another aspect all that is required is to add a second ground at a spool end of the wire at a far side of the insulated wire path from the free end and to insulate the wire path to prevent electric arc energy passing along said wire from going to the ground, except at either end of said wire path.

While reference has been made above to various preferred embodiments of the invention, these are provided by way of example only, and the scope of the invention is to be determined by referring to the attached claims. Thus, various alterations and variations of the invention are comprehended as being within the scope of the claims, some of which are discussed above, and others of which will be apparent as being within the claims to those skilled in the art. For example, there are a number of forms of ground that may be provided, either at the free end or the spool end, which forms will both provide for the removal of excess arc energy at one or both ends of the wire while preserving the integrity of wire insulation between the ends.

We claim:

1. A wire bonder for bonding an insulated wire to a surface, said wire bonder comprising:
   a bond head, having a bonding position adjacent to said surface and a wire preparation position spaced apart from said surface;
   a wire holder on said bond head, said wire holder being sized and shaped to permit a free end of said insulated wire to extend from the wire holder when said bond head is in the spaced apart position;
   a source of insulated wire for said bond head;
   an electrical discharge wand positioned adjacent to said bond head when said bond head is in the spaced apart position for directing sufficient electricity at said extending free end of said insulated wire to form a bond ball on said free end; and
   a first ground attached to said insulated wire, and positioned closely adjacent thereto at a point where the insulated wire extends from the wire holder to conduct electrical energy away from said bond wire to prevent said insulation on said bond wire remote from said free end from being damaged.

2. A wire bonder as claimed in claim 1 wherein said first ground is in the form of an electrically conductive wire holder adjacent to a free end of said wire.

3. A wire bonder as claimed in claim 2 wherein said electrically conductive wire holder is a capillary.

4. A wire bonder as claimed in claim 3 wherein said capillary is comprised in part of a dielectric material and in part by a conductive material.

5. A wire bonder as claimed in claim 3 wherein said capillary is comprised of tungsten carbide.

6. A wire bonder as claimed in claim 3 wherein said capillary includes a wire receiving tube formed therein.

7. A wire bonder as claimed in claim 6 wherein said wire receiving tube is tapered to form a throat, said throat being sized and shaped to closely surround said insulated wire, while still permitting said wire to be free running through said throat.

8. A wire bonder as claimed in claim 7 wherein said first ground is adjacent to said throat.

9. A wire holder as claimed in claim 8 wherein said throat is adjacent to an end of said capillary from which a free end of said wire projects.

10. A wire bonder as claimed in claim 1 further including a second ground in the form of an electrical connection to ground at a spool end of said wire.

11. A wire bonder as claimed in claim 1 wherein said wire bonder includes a wire path extending between a free end of said insulated wire and a spool end of said insulated wire and said wire path is insulated from ground.

12. A method of bonding insulated wire, said method comprising the steps of:
   feeding an insulated wire from a spool end through a bonding head until the insulated wire extends from the bond head at a free end;
   discharging an arc of electricity at said free end to form a bond ball;
   grounding said insulated wire in a manner such that said ground is positioned closely adjacent thereto at a point where the insulated wire extends from said conductive bond head to prevent said discharged electricity from going to ground anywhere along said insulated wire apart from at said ends; and
   advancing said bond head onto a surface to attach said bond ball and said insulated wire to a surface.

13. A method of bonding insulating wire as claimed in claim 12 further including the step of insulating a wire path between a source of insulated wire and said bond head.

14. A method of bonding insulating wire as claimed in claim 12 wherein said step of grounding said insulating wire comprises the step of grounding said free end of said insulated wire by forming said bond head out of a conductive material.

15. A method of bonding insulating wire as claimed in claim 14 wherein said step of grounding said insulating wire further comprises the step of forming an electrical connection to ground at said spool end of wire.

16. A kit for converting an uninsulated wire bonder to an insulating wire bonder, said kit comprising:

a replacement bond head for bonding insulated wire sized and shaped to replace a bond head suitable for uninsulated wire, said insulated wire having a spool end for initiating said insulated wire;

a wire holder associated with said replacement bond head for permitting insulated wire to extend from said bond head at a free end; and a first ground attached to said insulated wire and located closely adjacent thereto at a point where the insulated wire extends from said bond head to cause electricity directed at said free end of said insulated wire to go to said first ground without going to ground along said insulated wire between said ends.

17. The kit of claim 16 further including insulators for insulating a wire path between a first and second send of said insulated wire.

18. The kit of claim 16 wherein said first ground is comprised of an electrically conductive replacement bond head.

19. The kit of claim 16 further including a second ground comprising an electrical connection to ground located at said spool end of said insulated wire.

* * * * *